United States Patent

Voor et al.

(10) Patent No.: US 6,867,734 B2
(45) Date of Patent: Mar. 15, 2005

(54) SYSTEM AND METHOD FOR FREQUENCY MANAGEMENT IN A COMMUNICATIONS POSITIONING DEVICE

(75) Inventors: Thomas E. Voor, Lauderhill, FL (US); Sameh W. Tawadrous, Coral Springs, FL (US); Ronald H. Deck, Cooper City, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/439,200

(22) Filed: May 15, 2003

(65) Prior Publication Data

US 2003/0214436 A1 Nov. 20, 2003

Related U.S. Application Data

(60) Provisional application No. 60/380,832, filed on May 17, 2002.

(51) Int. Cl.[7] ................................................. G01S 5/14
(52) U.S. Cl. ..................................................... 342/357.1
(58) Field of Search ........................... 342/357.1, 357.09

(56) References Cited

U.S. PATENT DOCUMENTS

| | | |
|---|---|---|
| 5,742,908 A | 4/1998 | Dent |
| 5,841,396 A | 11/1998 | Krasner |
| 5,844,521 A | 12/1998 | Stephens et al. |
| 6,041,222 A | 3/2000 | Horton et al. |
| 6,064,336 A | 5/2000 | Krasner |
| 6,067,045 A | 5/2000 | Castelloe et al. |
| 6,122,506 A | 9/2000 | Lau et al. |
| 6,134,483 A | 10/2000 | Vayanos et al. |
| 6,204,808 B1 | 3/2001 | Bloebaum et al. |
| 6,400,314 B1 * | 6/2002 | Krasner ................. 342/357.09 |
| 6,400,319 B1 | 6/2002 | Castelloe et al. |
| 6,424,826 B1 | 7/2002 | Horton et al. |
| 6,501,420 B2 | 12/2002 | Townsend et al. |
| 6,519,466 B2 | 2/2003 | Pande et al. |
| 6,542,821 B2 | 4/2003 | Krasner |

* cited by examiner

Primary Examiner—Gregory C. Issing
(74) Attorney, Agent, or Firm—Scott M. Garrett

(57) ABSTRACT

A frequency management scheme for a hybrid communications/positioning device, such as a cellular/GPS or other combined device, generates a local clock signal for the communications portion of the device, using a crystal oscillator or other part. The oscillator output may be delivered to a phase locked loop to drive a high-frequency clock for the cellular or other communications portion of the hybrid device. A processor may determine frequency error between the phase locked loop and base station or other reference, to derive a digital frequency tracking message. A Doppler search or other logical control message may likewise be communicated from the processor to a GPS or other positioning receiver. The GPS receiver circuitry may consequently adjust Doppler center, window width or other parameters to enhance time to first fix or other performance. The architecture eliminates the need for a second crystal or other direct oscillator in the GPS receiver portion of the hybrid device, while still maintaining GPS performance. The architecture of the design also eliminates the need for frequency correcting elements in the crystal oscillator or other base reference oscillator or clock. The invention can furthermore be used in any system, radio, modem, transceiver, or receiver that has two or more receivers that share one reference or base oscillator or clock.

55 Claims, 2 Drawing Sheets

SYSTEM AND METHOD FOR FREQUENCY MANAGEMENT IN A COMMUNICATIONS POSITIONING DEVICE

CROSS REFERENCE TO RELATED APPLICATION

This application relates to and claims priority from U.S. Provisional Application Ser. No. 60/380,832 filed May 17, 2002, which application is incorporated by reference. This application is also related to the subject matter of U.S. application Ser. No. 10/438,441 entitled "SYSTEM AND METHOD FOR FREQUENCY MANAGEMENT IN A COMMUNICATIONS POSITIONING DEVICE", having Attorney Docket No. CM03716J and filed of even date with this application, having the same inventors as this application, being assigned to or under obligation of assignment to the same entity as this application, and which application is incorporated by reference in this application.

FIELD OF THE INVENTION

The invention relates to the field of communications, and more particularly to techniques for generating and managing precision frequency sources in cellular telephones or other communications devices having a positioning capability, such as Global Positioning System (GPS) or other location service.

BACKGROUND OF THE INVENTION

GPS receivers can be characterized by performance criteria such as acquisition and tracking time, which reflect the amount of processing necessary to detect and lock on to GPS satellite signals and hence the amount of time needed to begin accurately reporting a user's position. The acquisition time, tracking ability, sensitivity, position accuracy and other performance parameters of GPS receivers can be affected by a variety of factors. Those factors include the precision with which frequency references for radio frequency detection and other purposes can be generated and managed within the device. L1 GPS signals used for civilian coarse acquisition (C/A) purposes are broadcast at 1.575 GHz from the associated NAVSTAR satellites. Russian GLONASS satellites broadcast in a similar frequency range.

Handheld, vehicle-mounted, stationary and other positioning receivers including GPS receivers require frequency stability in their clocks generally in the range of a few parts per million or less to accurately derive Doppler and other data from reference signals, and therefore triangulate a precise receiver position within a reasonable acquisition time.

Recently, market trends have developed toward GPS functionality combined with other communications services. Various wireless devices, such as cellular telephones, digital pagers, wireless personal digital assistants, 802.11a/b/g and other clients may all be combined with GPS location receivers for various applications.

However, the accuracy of reference clocks generally employed in cellular telephones and other communications devices may generally not be as great as that needed for useful GPS service, which as noted may require accuracy to within at least a few parts per million, down to tenths of 1 part per million or less for increased performance in acquisition time, tracking, sensitivity, position accuracy and other factors. Cellular telephones on the other hand may contain uncompensated oscillators accurate to within only perhaps five to tens of parts per million, depending on implementation. Cellular devices may tolerate higher frequency variability in part because handsets or other devices may be able to derive a stable frequency reference from a base station or the wireless network, itself.

In the case of a GPS receiver combined with a cellular telephone for caller location service as mandated by the Federal Communications Commission, a cellular telephone's local crystal oscillator, tuned to 16.8 MHz or another base frequency, may for instance have a frequency variance of ±30 ppm or more or less. A cellular handset's internal clock may therefore not be sufficient to drive GPS circuitry in a combined device for useful GPS operation by itself. Temperature compensation circuits operating on ordinary crystal oscillators may improve the frequency reference to perhaps ±5 ppm or so, although those types of parts may add to the cost of a relatively low-cost mobile device. Solutions such as supplying two corrected reference oscillators, one for GPS and one for cellular or other communications service at different frequencies, for instance, may not be economical in a combined device. Other problems exist.

SUMMARY OF THE INVENTION

The invention overcoming these and other problems in the art relates in one regard to a system and method for frequency management in a combined communications/positioning system, in which a stable base reference may be derived for GPS purposes from a baseline frequency reference used to drive the communications side of the device. That baseline reference may in embodiments operate without direct correction such as for instance software temperature correction, hardware temperature correction, measurement of frequency bias at time of manufacture, automatic frequency control (AFC) or other techniques to establish accuracy in the communications portion of the device. The GPS receiver component may consequently receive that baseline reference and upconvert that reference to GPS frequencies, using an intermediate oscillator, integrated synthesizer or other element. The frequency reference for the positioning portion of the device will consequently also exhibit the same range of frequency variance as the original communications (baseline) clock. However, according to embodiments of the invention, a processor element communicating with the communications portion of the device may track frequency drift based on deviation from cellular base or other factors. That processor or other logical element may consequently communicate a Doppler search or other logical digital message to the positioning portion of the device, indicating the deviation of the original communications frequency reference. This logical digital message may contain predictive frequency information such as frequency drift rate which may be derived from thermodynamic properties of the system, along with empirical data and associated algorithms. The positioning receiver may then adjust the center frequency or width of the Doppler search window, frequency scan rate, or other search parameters to drive the position acquisition and tracking processing to be faster, sensitive to lower signal strengths, and have better position accuracy. The GPS or other positioning portion of the combined device therefore need not contain a local oscillator of its own, while still achieving sufficient GPS performance at comparatively low cost.

BRIEF DESCRIPTION OF THE DRAWINGS

The invention will be described with reference to the accompanying drawings, in which like elements are referenced with like numbers, and in which.

DETAILED DESCRIPTION OF EMBODIMENTS

Figure 1:
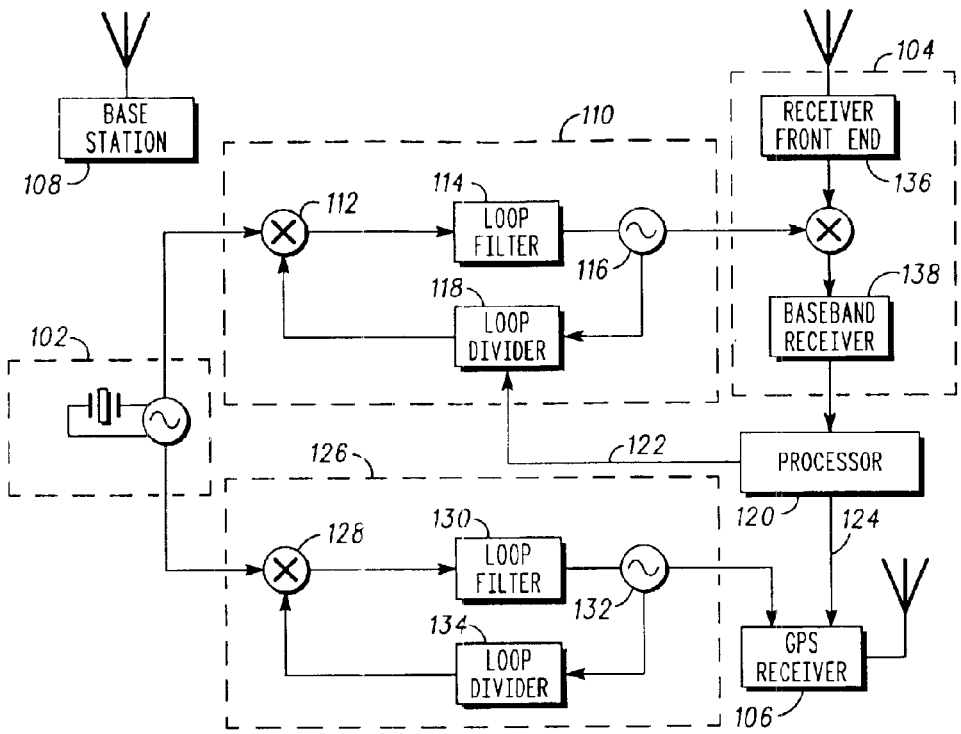
FIG. 1 illustrates a frequency management architecture, according to an embodiment of the invention.

An architecture in which a frequency management system according to the invention may be implemented is illustrated in FIG. 1, in which a combined communications/positioning device incorporates both GPS receiver circuitry 106 and a communications transceiver 104. As illustrated, the communications transceiver 104 may include a receiver front end 136 for detection and downconversion of communications carrier signals, such as cellular telephone or other radio frequency (RF) or other signals, as well as a baseband receiver 138 for processing downconverted communications signals. The communications transceiver 104 of the combined device may be or include for instance a portable radio, cellular telephone, two-way or other pager, wireless modem, wireless personal digital assistant or other device that receives or transmits a radio, optical or other wireless communications signal. In embodiments, the communications transceiver 104 may communicate with or receive signals from a base station 108, such as a cellular base station, or other communications facility or site.

The combined communications/positioning device as illustrated may contain a base oscillator 102 to provide a frequency reference to ultimately drive the communications transceiver 104 as well as the GPS receiver circuitry 106. In embodiments base oscillator 102 may be a free-running, uncompensated reference part. The base frequency of the base oscillator 102 may be set to values compatible with cellular or other operation at 800/900 MHz, 1900 MHz or other frequency ranges. The base oscillator 102 may for example be set to 16.8 MHz or other frequencies which may be multiplied to carrier ranges. An uncompensated crystal oscillator such as may be used to implement base oscillator 102 may by itself typically exhibit, for instance, a frequency deviation of ±30 ppm or more or less. In implementations the base oscillator 102 may be or include a temperature corrected crystal oscillator (TCXO) or other compensated part achieving tighter or better frequency tolerance.

The base oscillator 102 as illustrated may deliver a frequency reference to a first phase locked loop 110 to drive operating frequencies for cellular or other communications or other operations. The first phase locked loop 110 may include a phase comparator 112, to compare the phase of the base oscillator 102 with the phase of a high-frequency oscillator 116. High-frequency oscillator 116 may for instance be implemented as a voltage controlled high-frequency oscillator (VCO) generating frequencies, for instance, in the 800/900 MHz, 1900 MHz or other ranges for cellular or other operation. A loop filter 114 may low-pass filter the output of the phase comparator 112 to remove higher frequency artifacts or other noise, and stabilize the phase locked loop 110.

The output of the loop filter 114 may in turn drive the high-frequency oscillator 116 to operating frequencies, which through the return provided by loop divider 118 completes a closed feedback loop to phase comparator 112. The phase of the high-frequency oscillator 116 is thereby locked to the phase of the base oscillator 102, so that the phase angle between them remains zero or approximately zero, or at a fixed or approximately fixed separation during operation.

The clock reference of the high-frequency oscillator 116 forms an output of the first phase locked loop 110, which may in turn drive communications transceiver 104 to demodulate, downconvert and receive the wireless signals broadcast to the communications device, or perform other communications operations. According to this embodiment in one regard, the frequency reference of high-frequency oscillator 116 may be programmed or scaled according to operating needs, such as for instance for multi-band operation for cellular handsets, or other implementations.

The communications transceiver 104 may acquire and lock to base station 108, such as a cellular base station, or other communications sites or networks. Once registered to base station 108 the communications transceiver 104 may measure the degree of frequency offset between the output of the first phase locked loop 110 driving communications transceiver, and the base station 108. The frequency offset may be tracked to a fairly high accuracy, for instance ±0.2 ppm or more or less, in part because cellular or other base station 108 may maintain accurate cesium or other clock references which may be broadcast over their communications channels.

Once a frequency offset is determined, according to embodiments of the invention a processor 120 may communicate a digital frequency tracking message 122 to loop divider 118 or other element of first phase locked loop 110. That digital frequency tracking message 122, such as an automatic frequency control word or other message or data, may permit the fine tuning of the loop divide ratio or other parameters to cause the output of first phase locked loop 110 to track the frequency of base station 108 in frequency over time. Processor 120 may be or include, for instance, a general purpose programmable processor such as a Motorola ColdFire™ family of processors or others, a digital signal processor such as a Motorola 56000™ family of DSPs, or other logical elements or processors.

According to embodiments of the invention, the processor 120 may also communicate with the GPS receiver circuitry 106 within the combined device. The GPS receiver circuitry 106 itself may in general operate based on a clock signal likewise derived from base oscillator 102. More specifically, in an embodiment as shown in FIG. 1, the output of base oscillator 102 may be communicated to a second phase locked loop 126. Second phase locked loop 126 may receive the output of base oscillator 102 in a phase comparator 128. Phase comparator 128 may compare the phase of the output of base oscillator 102 and the output of a loop divider 134 which divides the output of a high-frequency oscillator 132. The output of phase comparator 128 may be filtered in loop filter 130, and the output transmitted to high-frequency oscillator 132. High-frequency oscillator 132 may therefore remain locked to base oscillator 102.

The output of second phase locked loop 126 in the form of high-frequency oscillator 132 may be communicated to GPS receiver 106, and drive that receiver as reference clock. In embodiments, that clock signal may be at 1.575 GHz or other frequencies. GPS receiver may initiate acquisition of Gold codes or other GPS or positioning signals based on that clock. According to the embodiment illustrated in FIG. 1, therefore, a frequency reference from base oscillator 102 may be communicated to the GPS receiver circuitry 106 in parallel with the communications or other circuitry, without requiring a local oscillator in the GPS receiver circuitry 106 itself. Since the accuracy of the output of the second phase locked loop 126 may track the accuracy of the base oscillator 102, this upconvert process may provide a reference signal to the GPS receiver circuitry 106 having an accuracy in embodiments of ±5 ppm to 0.2 ppm or more or less, depending on the type of crystal or other oscillator element used.

After the communications transceiver 104 of the combined communications/positioning device along with processor 120 have tracked frequency deviation in the communications portion based on base station 108, processor 120 may likewise communicate a Doppler search message 124 to the GPS receiver 106. Since the detected frequency deviation in communications transceiver 104 derives from first phase locked loop 110 locked to base oscillator 102, the same information may be usefully employed to adjust the operation of GPS receiver 106. For example, in embodiments the GPS receiver 106 may adjust the Doppler center frequency, or the width of the Doppler search message, or other Doppler or other parameters based on Doppler search message 124. In embodiments, for instance, knowledge of frequency deviation in base oscillator 102 may permit the Doppler search window, or frequency bands around center through which searching is done to detect Gold code or other signals, to be narrowed. A narrower Doppler search window may require less time to scan and process for those signals, resulting in faster time to first fix, detection of weaker GPS signals, or improve other performance characteristics.

The GPS receiver circuitry 106 may consequently acquire and track GPS signals without the added costs and complexity of incorporating an additional local oscillator as well as associated automatic frequency control (AFC) or other signal processing circuitry or software to enhance the frequency reference for that portion of the combined device.

Figure 2:
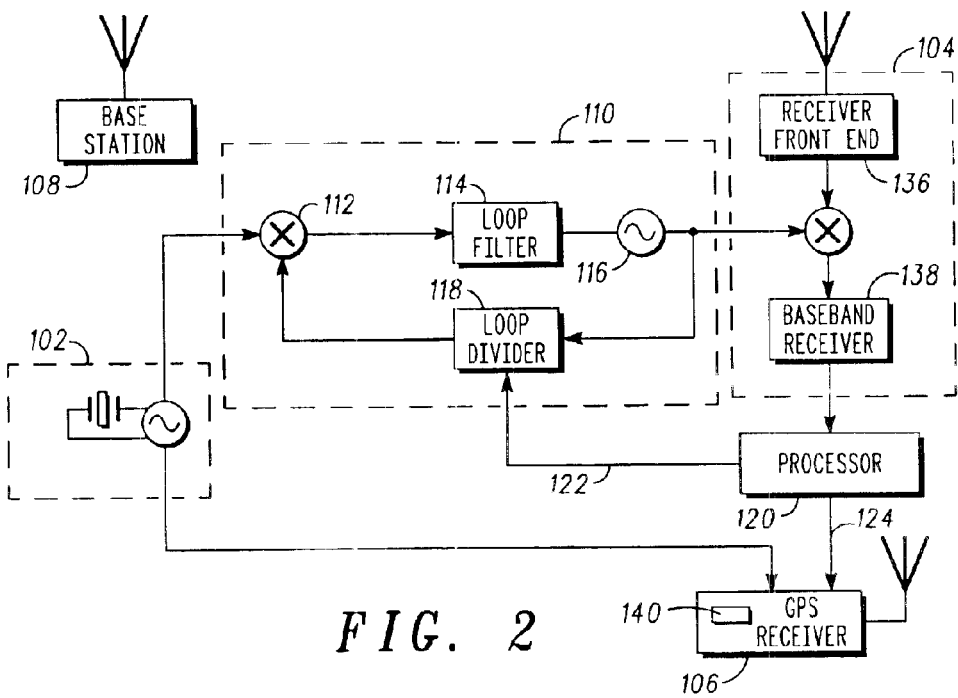
FIG. 2 illustrates a frequency management architecture, according to another embodiment of the invention.

In an embodiment of the invention illustrated in FIG. 2, the output of base oscillator 102 may be communicated directly to the GPS receiver circuitry, omitting any intervening frequency synthesizer module, if that generation is not needed for operation in given implementations. In such embodiments, the GPS receiver circuitry 106 may itself contain, for instance, an integral synthesizer 140 or other frequency generation module, to derive the necessary 1.575 GHz or other downconvert frequency for GPS or other positioning operation. Similarly to the embodiment illustrated in FIG. 1, in operation processor 120 may communicate a Doppler search message 124 to GPS receiver 106, for dynamic adjustment of Doppler search parameters such as Doppler search window width, frequency drift velocity, frequency error predictive estimates, or other control parameters.

Figure 3:
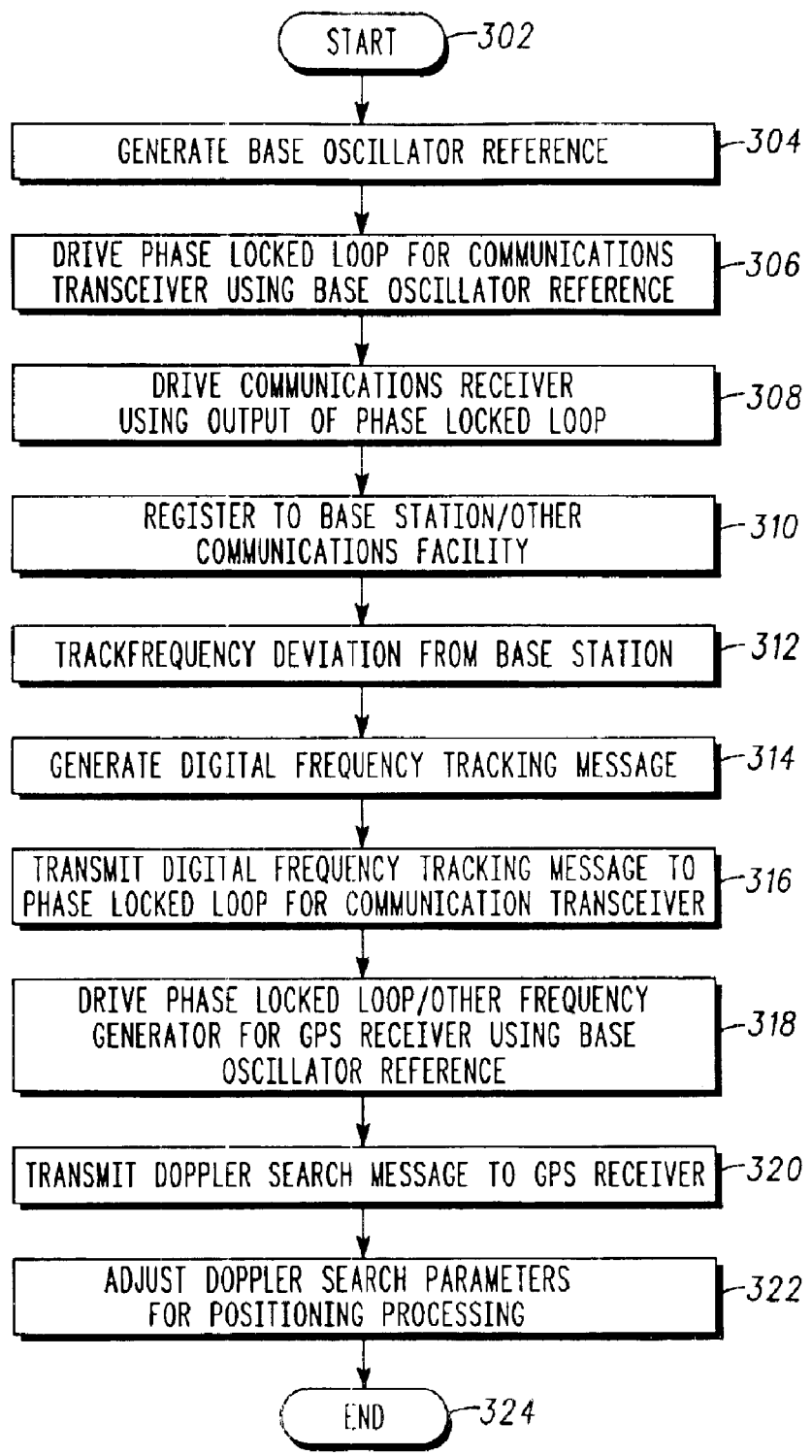
FIG. 3 illustrates a flowchart of frequency management processing according to an embodiment of the invention.

Overall processing according to embodiments of the invention is illustrated in FIG. 3. In step 302, processing begins. In step 304, a clock reference signal may be generated by base oscillator 102, for instance at 16.8 MHz or other frequencies. In step 306, the output of base oscillator 102 may be used to drive first phase locked loop 110 for communications transceiver 104. In step 308, the communications transceiver 104 may be driven for downconvert and other communications operation using the output of first phase locked loop 110. In step 310, the communications transceiver 104 may register to base station 108 or other communications facility or site. In step 312, the frequency deviation between high-frequency oscillator 116 driving communications transceiver 104 and the frequency reference of base station 108 may be tracked. In step 314, a digital frequency tracking message 122 may be generated by processor 120 or other part.

In step 316, the digital frequency tracking message 122 may be transmitted to first phase locked loop 110 to adjust the operation of first phase locked loop 110 using automatic frequency control (AFC) or other frequency tracking or other control. In step 318, the output of base oscillator 102 may be used to drive second phase locked loop 126 which in turn drives GPS receiver 106, for instance at 1.575 GHz or other frequencies. In step 320, Doppler search message 124 may be transmitted by processor 120 to GPS receiver. In step 322, GPS receiver may adjust Doppler search parameters, such as starting or center frequency or Doppler search window width, to adapt positioning processing. In step 324, processing may end.

The foregoing description of the invention is illustrative, and variations in configuration and implementation will occur to persons skilled in the art. For instance, while the first phase locked loop 110 locking high-frequency oscillator 116 to base oscillator 102, as well as second phase locked loop 126 locking high-frequency oscillator 132 to base oscillator 102, have been generally described in terms of a negative feedback topology including a comparator, loop filter, high-frequency oscillator and feedback divider, in embodiments the phase locking function may be implemented in other circuit configurations, by software algorithms, or other combinations of hardware and software.

Further, while the communications transceiver 104 and related circuitry has generally been described in terms of a cellular telephone equipped with positioning capability, other communications receivers or transceivers may be used. For instance, in embodiments a passive communications receiver rather than a two-way communications transceiver 104 may be implemented to track frequency deviation compared to base station 108 or other references. Other receivers, transceivers, modems or other communications components may be used. For instance, in embodiments satellite-based communications receivers or transceivers, data links or other wired, wireless, optical and other interfaces or channels may be used. Likewise again, while the invention has generally been described in terms of a GPS device as the positioning receiver, other positioning systems or a combination of positioning systems may be used. Furthermore, while the invention has generally been described in terms of a pair of communications and positioning receivers, modems or elements, in embodiments three or more communications, positioning or other receivers, modems or other communications devices may be employed, in which information derived from the most accurate tracking source may be used as a reference to adjust the seek or other behavior of remaining receivers or modems sharing a base oscillator. The invention is accordingly intended to be limited only by the following claims.

We claim:

1. A system for generating a frequency reference in a hybrid communications device, comprising:
   a clock source generating a clock signal at a base frequency;
   a communications receiver, the communications receiver performing communications processing based on an input of the clock signal at the base frequency, the communications receiver generating frequency tracking data;
   a positioning receiver, the positioning receiver performing positioning processing based on an input of the clock signal at the base frequency; and
   a processor, the processor communicating with the communications receiver and the positioning receiver, the processor transmitting a control message to the positioning receiver to adapt positioning processing based on the frequency tracking data.

2. A system according to claim 1, wherein the clock source comprises an oscillator.

3. A system according to claim 2, wherein the input of the clock signal to the communications receiver comprises the input of the clock signal at the base frequency to a first synthesizer.

4. A system according to claim 2, wherein the input of the clock signal to the positioning receiver comprises the input of the clock signal at the base frequency to a second synthesizer.

5. A system according to claim 4, wherein the second synthesizer comprises a discrete second synthesizer.

6. A system according to claim 4, wherein the second synthesizer comprises an integral second synthesizer.

7. A system according to claim 6, wherein the integral second synthesizer is integrated in the positioning receiver.

8. A system according to claim 1, wherein the communications receiver comprises at least one of a cellular telephone, a personal digital assistant, a two-way pager, a radio receiving device, a modem, and a network-enabled wireless device.

9. A system according to claim 1, wherein the communications receiver comprises at least one of a radio receiving device, transceiver, a wireless modem, a wired modem and an optical receiver.

10. A system according to claim 1, wherein the positioning receiver comprises a Global Positioning System receiver.

11. A system according to claim 1, wherein the frequency tracking data comprises an automatic frequency control message.

12. A system according to claim 11, wherein the automatic frequency control message comprises frequency deviation data generated by comparison to a base station signal.

13. A system according to claim 1, wherein the control message to the positioning receiver comprises a Doppler search message.

14. A system according to claim 13, wherein the Doppler search message comprises at least one of frequency center data, frequency tolerance data, Doppler window data, predictive frequency information, and frequency drift rate.

15. A system according to claim 14, wherein the frequency drift rate is derived from at least one of thermodynamic properties of the system, empirical data and associated algorithms.

16. A method for generating a frequency reference in a hybrid communications device, comprising:
generating a clock signal at a base frequency;
performing communications processing in a communications receiver based on an input of the clock signal at the base frequency;
generating frequency tracking data in the communications receiver;
performing positioning processing in a positioning receiver based on an input of the clock signal at the base frequency; and
transmitting a control message to the positioning receiver to adapt positioning processing based on the frequency tracking data.

17. A method according to claim 16, wherein the step of generating a clock source comprises exciting an oscillator.

18. A method according to claim 17, further comprising a step of inputting the clock signal at the base frequency to a first synthesizer to perform communications processing.

19. A method according to claim 17, further comprising a step of inputting the clock signal at the base frequency to a second synthesizer to perform positioning processing.

20. A method according to claim 19, wherein the second synthesizer comprises a discrete second synthesizer.

21. A method according to claim 19, wherein the second synthesizer comprises an integral second synthesizer.

22. A method according to claim 21, wherein the integral second synthesizer is integrated in the positioning receiver.

23. A method according to claim 16, wherein the communications receiver comprises at least one of a cellular telephone, a personal digital assistant, a two-way pager, a radio receiving device, a modem, and a network-enabled wireless device.

24. A method according to claim 16, wherein the communications receiver comprises at least one of a radio receiving device, transceiver, a wireless modem, a wired modem and an optical receiver.

25. A method according to claim 16, wherein the positioning receiver comprises a Global Positioning System receiver.

26. A method according to claim 16, wherein the frequency tracking data comprises an automatic frequency control message.

27. A method according to claim 26, wherein the automatic frequency control message comprises frequency deviation data generated by comparison to a base station signal.

28. A method according to claim 16, wherein the control message to the positioning receiver comprises a Doppler search message.

29. A method according to claim 28, wherein the Doppler search message comprises at least one of frequency center data, frequency tolerance data, Doppler window data, predictive frequency information, and frequency drift rate.

30. A method according to claim 29, further comprising a step of deriving the frequency drift rate from at least one of thermodynamic properties of the system, empirical data and associated algorithms.

31. A system for generating a frequency reference in a hybrid communications device, comprising:
clock source means for generating a clock signal at a base frequency;
communications receiver means, the communications receiver means for performing communications processing based on an input of the clock signal at the base frequency, the communications receiver means generating frequency tracking data;
positioning receiver means, the positioning receiver means for performing positioning processing based on an input of the clock signal at the base frequency; and
processor means, the processor means communicating with the communications receiver means and the positioning receiver means, the processor means for transmitting a control message to the positioning receiver means to adapt positioning processing based on the frequency tracking data.

32. A system according to claim 31, wherein the clock source means comprises oscillator means.

33. A system according to claim 32, wherein the input of the clock signal to the communications receiver means comprises the input of the clock signal at the base frequency to first synthesizer means.

34. A system according to claim 32, wherein the input of the clock signal to the positioning receiver means comprises the input of the clock signal at the base frequency to second synthesizer means.

35. A system according to claim 34, wherein the second synthesizer means comprises discrete second synthesizer means.

36. A system according to claim 34, wherein the second synthesizer means comprises integral second synthesizer means.

37. A system according to claim 36, wherein the integral second synthesizer means is integrated in the positioning receiver means.

38. A system according to claim 31, wherein the communications receiver means comprises at least one of cellular telephone means, personal digital assistant means, two-way pager means, radio receiving means, modem means, and network-enabled wireless device means.

39. A system according to claim 31, wherein the communications receiver means comprises at least one of radio receiving device means, transceiver means, wireless modem means, wired modem means and optical receiver means.

40. A system according to claim 31, wherein the positioning receiver means comprises Global Positioning System receiver means.

41. A system according to claim 31, wherein the frequency tracking data comprises an automatic frequency control message.

42. A system according to claim 41, wherein the automatic frequency control message comprises frequency deviation data generated by comparison to a base station signal.

43. A system according to claim 31, wherein the control message to the positioning receiver means comprises a Doppler search message.

44. A system according to claim 43, wherein the Doppler search message comprises at least one of frequency center data, frequency tolerance data, Doppler window data, predictive frequency information, and frequency drift rate.

45. A system according to claim 44, wherein the frequency drift rate is derived from at least one of thermodynamic properties of the system, empirical data and associated algorithms.

46. A system, comprising:
at least two signal receiving elements;
a base oscillator, the base oscillator generating a clock signal at a base frequency to communicate to the at least two signal receiving elements; and
a processor, the processor communicating with the at least two signal receiving elements, acquiring frequency tracking data from a first signal receiving element among the at least two signal receiving elements, and generating a control message to enhance the performance of at least one of the remaining signal receiving elements based on the frequency tracking data.

47. A system according to claim 46, wherein the least two signal receiving elements comprise at least one receiver.

48. A system according to claim 47, wherein the at least one receiver comprises at least one wireless receiver.

49. A system according to claim 47, wherein the at least one receiver comprises at least one wired receiver.

50. A system according to claim 47, wherein the at least one receiver comprises at least one optical receiver.

51. A system according to claim 46, wherein the at least two signal receiving elements comprise at least one modem.

52. A system according to claim 51, wherein the at least one modem comprises a wireless modem.

53. A system according to claim 51, wherein the at least one modem comprises a wired modem.

54. A system according to claim 51, wherein the at least one modem comprises an optical modem.

55. A system according to claim 46, wherein the at least two signal receiving elements comprise at least three signal receiving elements.

* * * * *